United States Patent
Shimura

[11] Patent Number: 5,936,576
[45] Date of Patent: Aug. 10, 1999

[54] MEASUREMENT OF AMPLITUDES AND PHASES OF SIGNALS AT A HIGH SPEED AND WITH HIGH RELIABILITY

[75] Inventor: Takashi Shimura, Tokyo, Japan

[73] Assignee: Advantest Corporation, Tokyo, Japan

[21] Appl. No.: 09/135,466

[22] Filed: Aug. 17, 1998

[30] Foreign Application Priority Data

Aug. 22, 1997 [JP] Japan ................................. 9-226602

[51] Int. Cl.⁶ .......................... H01Q 3/22; H01Q 3/24; H01Q 3/26
[52] U.S. Cl. ..................... 342/368; 342/192; 342/196
[58] Field of Search .................................. 342/192, 195, 342/196, 368, 372, 373

[56] References Cited

U.S. PATENT DOCUMENTS

| | | | |
|---|---|---|---|
| 5,093,563 | 3/1992 | Small et al. ............................ | 250/201.5 |
| 5,184,134 | 2/1993 | Niho et al. ............................... | 342/25 |
| 5,361,072 | 11/1994 | Barrick et al. ........................... | 342/133 |

*Primary Examiner*—Thomas Tarcza
*Assistant Examiner*—Dao L. Phan
*Attorney, Agent, or Firm*—Knobbe, Martens, Olson & Bear, LLP

[57] ABSTRACT

A multi-input amplitude and phase measuring method is disclosed for measuring the amplitudes and the phases of measurement signals at a high speed and with a high degree of reliability. Measurement signals received by antennae are converted into IF signals with local signals of frequencies $f_{LO}+\Delta f$, $f_{LO}+2\Delta f$, $f_{LO}+3\Delta f$, $f_{LO}+4\Delta f$ by a mixer and then added by an adder, whereafter they are multiplied by an analog multiplier to convert phase information of the measurement signals into signals of frequencies $\Delta f$, $2\Delta f$, $3\Delta f$, $4\Delta f$. Then, the signals obtained by the conversion are A/D converted and Fourier transformed to determine a spectrum. Then, in order to eliminate an influence of phase displacement by band-pass filters, the local signals are added by an adder and multiplied by a local signal of frequency $f_{LO}$ by a mixer, and the resultant signal is A/D converted and Fourier transformed to determine a spectrum. A cross spectrum of the two spectra is calculated by a cross spectrum calculator to measure the amplitudes and the phases of the measurement signals.

6 Claims, 3 Drawing Sheets

5,936,576

MEASUREMENT OF AMPLITUDES AND PHASES OF SIGNALS AT A HIGH SPEED AND WITH HIGH RELIABILITY

BACKGROUND OF THE INVENTION

1. Field of the Invention

This invention relates to a multi-input amplitude and phase measuring device which measures the phase differences and the amplitudes of signals of the same frequency received by means of a plurality of antennae.

2. Description of the Related Art

A multi-input amplitude and phase measuring device measures the phase differences and amplitudes of signals received by means of a plurality of measurement antennae arranged in a juxtaposed relationship to each other to find the direction of arrival of a radio wave or to identify an unwanted radiation source such as an electronic circuit.

To this end, using a signal received by one of the plurality of antennae as a reference signal, the phases and the amplitudes of measurement signals received by the other antennae are measured.

A construction and operation of a conventional multi-input amplitude and phase measuring device will be described with reference to FIG. 1.

The conventional multi-input amplitude and phase measuring device includes an antenna 1, a local signal generator 3, a mixer 2, a band-pass filter 7, an antennae 4, 14, 15 and 16, a switch 17, a local signal generator 6, a mixer 5, a band-pass filter 8, an analog mixer 9, a band-pass filter 10, a vector detector 11, an arithmetic unit 12 and display unit 13.

Antenna 1 receivers a reference signal of frequency $f_{RF}$. Local signal generator 3 generates a local signal of frequency $f_{LO}$. Mixer 2 multiplies the reference signal received by antenna 1 and the local signal of frequency $f_{LO}$ together to output the resultant signal. Band-pass filter 7 passes only a signal of frequency $f_{RF}-f_{LO}$ of the signal supplied from mixer 2. Antennae 4, 14, 15 and 16 receive measurement signals of frequency $f_{RF}$.

Switch 17 selects one of antennae 4, 14, 15 and 16. Local signal generator 6 outputs a local signal of frequency $f_{LO}+\Delta f$. Mixer 5 multiplies the measurement signal received by the antenna selected by switch 17 and the local signal of frequency $f_{LO}+\Delta f$ and outputs the resultant signal. Band-pass filter 8 passes therethrough and outputs only the signal of frequency $f_{RF}-f_{LO}-\Delta f$ of the signal supplied from mixer 5.

Analog mixer 9 multiplies the signal supplied from band-pass filter 7 and the signal supplied from band-pass filter 8 together to output the resultant signal. Band-pass filter 10 passes only a signal of frequency $\Delta f$ of the signal supplied from analog mixer 9. Vector detector 11 detects the phase difference between the measurement signal and the reference signal and the amplitude of the measurement signal using the signal of frequency $\Delta f$ supplied from band-pass filter 10. Arithmetic unit 12 performs a process for displaying the data of the phase and the amplitude detected by vector detector 11. Display unit 13 displays the data processed by arithmetic unit 12.

Operation of the conventional multi-input amplitude and phase measuring device will be described below with reference to FIG. 1.

A reference signal of frequency $f_{RF}$ received by antenna 1 is multiplied by a local signal of frequency $f_{LO}$ supplied from local signal generator 3 by mixer 2. Then, only the signal of frequency $|f_{RF}-f_{LO}|$ passes through band-pass filter 7 to be outputted as an IF (intermediate frequency) signal.

Meanwhile, the measurement signal of frequency $f_{RF}$ received by antenna 4 is delivered through switch 17 to mixer 5, by means of which it is multiplied by local signal 6 of frequency $f_{LO}+\Delta f$ supplied from local signal generator 6 by mixer 5. Then, only the signal of frequency $|f_{RF}-f_{LO}-\Delta f|$ passes through band-pass filter 8 and is outputted as an IF signal.

The output signals of band-pass filters 7 and 8 are then multiplied by analog mixer 9, and only the signal of frequency $\Delta f$ passes through band-pass filter 10 and is outputted. If the signals supplied from band-pass filters 7 and 8 have the same spectra, then the signal supplied from band-pass filter 10 is a single frequency signal which includes phase information of the measurement signal of antenna 4 in a case where the signal received by antenna 1 is used as a reference for the phase, and the amplitude and the phase of the signal can be measured by vector detector 11.

Further, if antennae 14, 15 and 16 having the same characteristics as antenna 4 are individually disposed at required measurement points and switch 17 is switched suitably, then the amplitudes and the phases of the signals detected at the plurality of measurement points can be measured without scanning a measurement antenna. The time required for measurement, which normally takes ten minutes or more when measurement is performed at a plurality of measurement points using a single measurement antenna, can be reduced by disposing a plurality of measurement antennae in a juxtaposed relationship to each other.

Then, the results of measurement of amplitude and phase are processed suitably at arithmetic unit 12, and the results of the processing are displayed on display unit 13.

With the conventional multi-input amplitude and phase measuring device, a mechanical switch is usually employed as switch 17. However, since a mechanical switch requires several tens of ms for switching, the more the number of measurement antennae or the number of switching contacts of the switch is, the larger the measurement time is. The mechanical switch has additional problems difficult to solve such as the problem of the life of the switch arising from repetitions of high speed switching and the variation of the insertion loss.

Where a semiconductor switch is used as switch 17, although the problem of the switching time is solved, it is difficult, at the present time, to achieve sufficient isolation compared with a mechanical switch.

Further, with a method using a switch, in a case the measurement signal is one pulse signal, all switching and measurement are not completed until a next pulse is generated. Therefore, it takes a longer time to measure, using a pulse with a long cycle period.

SUMMARY OF THE INVENTION

It is an object of the present invention to provide a multi-input amplitude and phase measuring method and method which, when a plurality of measurement antennae are used and arranged in parallel to measure amplitude and phase distributions on a scanning plane, are capable of measuring the amplitudes and the phases of measurement signals at a high speed and with a high degree of reliability.

According to one aspect of the present invention, a plurality of measurement signals are converted into a plurality of second intermediate frequency signals of low frequencies with the use of a plurality of second local signals of a plurality of frequencies, and the second intermediate frequency signals are multiplied by a first intermediate frequency signal to produce signals of fixed frequency intervals which include measurement information of the measurement signals. The signals with the fixed frequency intervals are then A/D converted and Fourier transformed to determine a spectrum, thereby performing simultaneous measurement of the amplitudes and the phases of the plurality of measurement signals. In addition, in order to eliminate the influence of phase displacement upon production of the second local signals, a signal obtained through the addition of the second local signals is multiplied by the first local signal to produce signals of second fixed frequency intervals. The signals of the second fixed frequency intervals undergoes A/D conversion and Fourier transformation to determine a spectrum, and a cross spectrum of the two spectra is calculated.

Accordingly, since measurement of the amplitudes and the phases of a plurality of measurement signals with high frequencies of narrow bands is performed simultaneously without using a switch, the reliability of the device can be enhanced and measurement of the amplitudes and the phases of the measurement signals can be performed at a high speed.

According to another aspect of the present invention, a plurality of measurement signals are converted into a plurality of second intermediate frequency signals of high frequencies with the use of a plurality of second local signals of a plurality of frequencies, and then converted into fourth intermediate frequency signals of low frequencies with the use of a third local signal. The fourth intermediate frequency signals are multiplied by a third intermediate frequency signal to produce signals of fixed frequency intervals which include phase information of the measurement signals. Then, the signals of the fixed frequency intervals are A/D converted and Fourier transformed to determine a spectrum, thereby performing measurement of the amplitudes and the phases of the plurality of measurement signals simultaneously. Finally, in order to eliminate the influence of phase displacement upon production of the second local signals, a signal obtained through the addition the second local signals are multiplied by the first local signal to produce signals of second fixed frequency intervals, which undergoes A/D conversion and Fourier transformation to determine a spectrum, and a cross spectrum of the two spectra is calculated.

Accordingly, since measurement of the amplitudes and the phases of a plurality of measurement signals of high frequencies of narrow bands is performed simultaneously without using a switch, the reliability of the device can be enhanced and measurement of the amplitudes and the phases of the measurement signals can be performed at a high speed.

According to a third aspect of the present invention, a plurality of second local signals are produced using a first local signal and an M-sequence code generator.

Accordingly, the relationship between the phases of the first and second local signals is not varied by the timing at which power supply is turned on or some other factor. In addition, even if the number of second antennae is increased or decreased, the number of local signal generators need not be varied.

The above and other objects, features and advantages of the present invention will become apparent from the following description with reference to the accompanying drawings which illustrate examples of the present invention.

DETAILED DESCRIPTION OF THE PREFERRED EMBODIMENTS

FIRST EMBODIMENT

In the present embodiment, five signals of frequency $f_{rf}$ are received, and one of the five signals as a reference signal the amplitude and phases of other four signals are measured.

Figure 1:
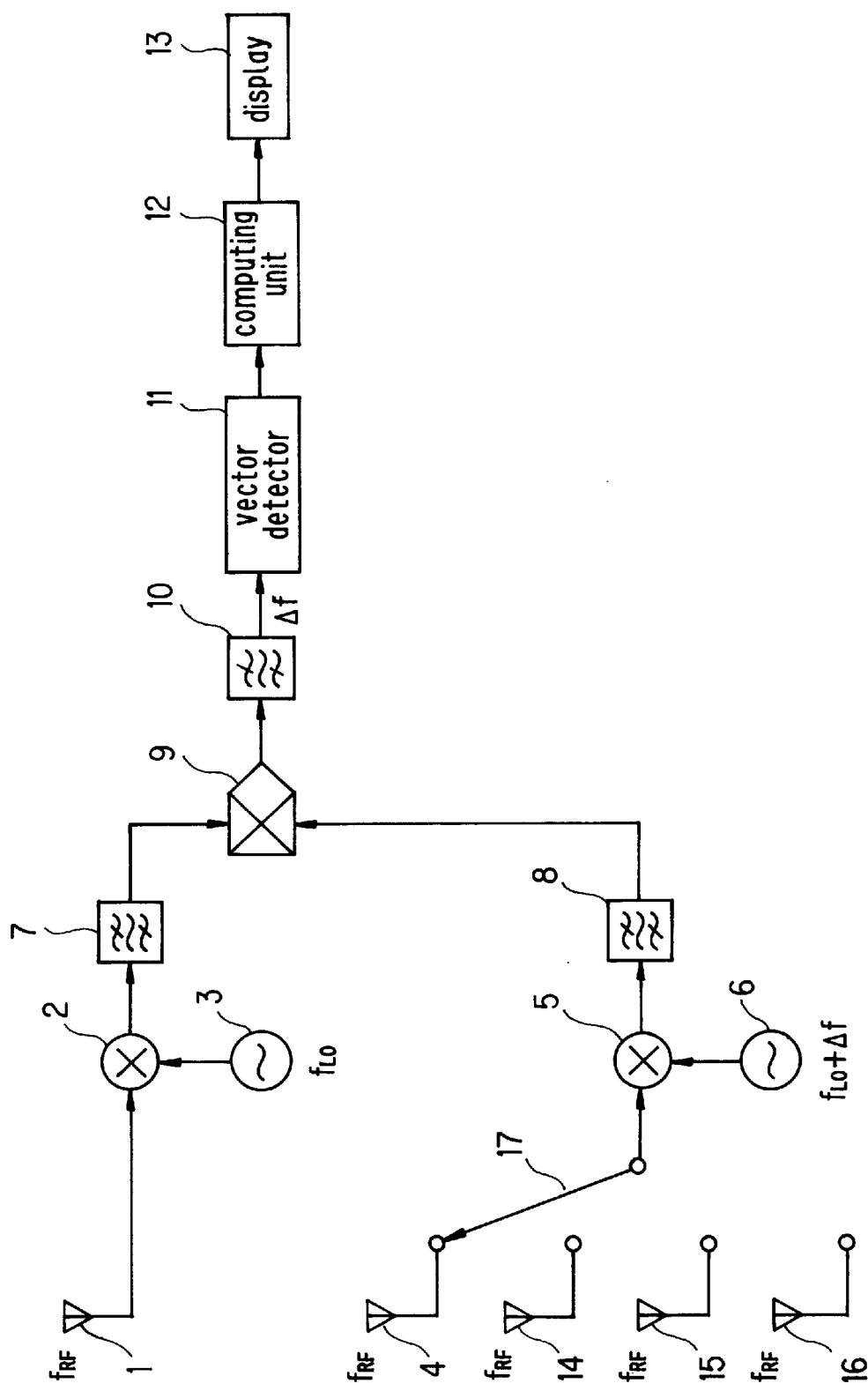
FIG. 1 is a block diagrams showing a construction of a conventional multi-input amplitude and phase measuring device.
Figure 2:
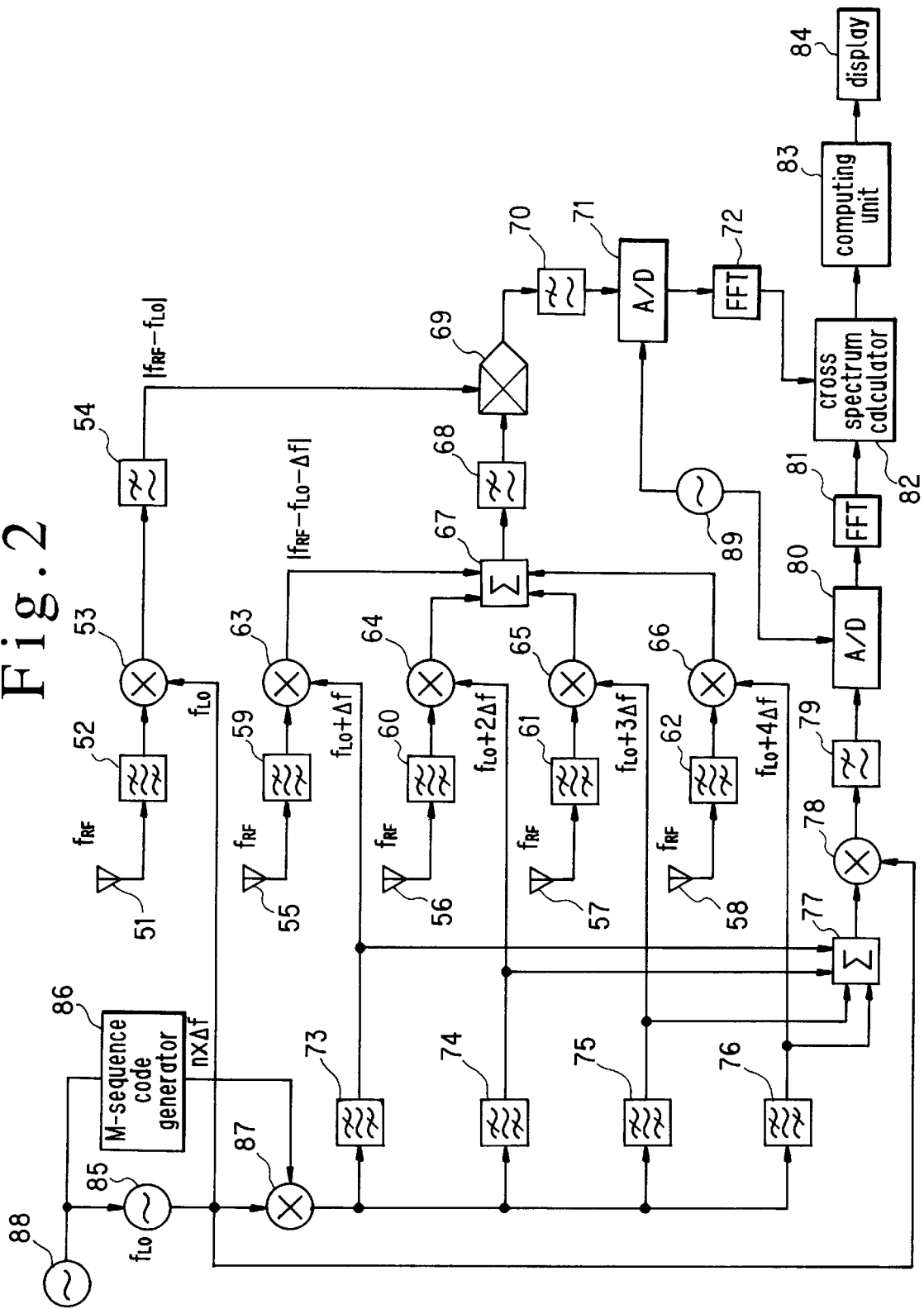
FIG. 2 is a block diagram showing a construction of a multi-input amplitude and phase measuring device of a first embodiment according to the present invention.

Referring to FIG. 2, the multi-input amplitude and phase measuring device of the present embodiment includes a reference signal source 88, a local signal generator 85, an M-sequence code generator 86, a mixer 87, band-pass filters 73 to 76, antenna 51 for receiving a reference signal, antennae 55 to 58 for receiving measurement signals, band-pass filters 52 and 59 to 62, mixers 53 and 63 to 66, adder 67, low-pass filter 68, a low-pass filter 54, an analog mixer 69, a low-pass filter 70, a sampling clock generator 89, an A/D (Analogue/Digital) converter 71, a FFT (Fast Fourier Transformer) 72, an adder 77, a mixer 78, a low-pass filter 79, an A/D converter 80, a FFT 81, a cross spectrum calculator 82, an arithmetic unit 83 and a display unit 84.

Reference signal source 88 produces a signal of a fixed frequency. Local signal generator 85 produces a local signal of frequency $f_{LO}$ synchronized with the phase of the output signal of reference signal source 88. M-sequence code generator 86 produces a signal of a frequency equal to an integral number of times frequency $\Delta f$ synchronized with the phase of the output signal of reference signal source 88. Mixer 87 multiplies the local signal of frequency $f_{LO}$ supplied from local signal generator 85 by the signal supplied from M-sequence code generator 86 and outputs a resultant signal.

Band-pass filter 73 passes therethrough and outputs only a signal of frequency $f_{LO}+\Delta f$ of the signal supplied from mixer 87. Band-pass filter 74 passes therethrough and outputs only a signal of frequency $f_{LO}+2\Delta f$ of the signal supplied from mixer 87. Band-pass filter 75 passes therethrough and outputs only a signal of frequency $f_{LO}+3\Delta f$ of the signal supplied from mixer 87. Band-pass filter 76 passes therethrough and outputs only a signal of frequency $f_{LO}+4\Delta f$ of the signal supplied from mixer 87. Band-pass filters 52 and 59 to 62 have a center frequency of frf, and pass therethrough and output only signals of frequency $f_{RF}$ of the signals received by antennae 51 and 55 to 58, respectively.

Mixer 53 multiplies the local signal of frequency $f_{LO}$ supplied from local signal generator 85 by the signal supplied from band-pass filter 52 and outputs the resultant signal. Mixer 63 multiplies the local signal of frequency $f_{LO}+\Delta f$ supplied from band-pass filter 73 by the signal supplied from band-pass filter 59 and outputs the resultant signal. Mixer 64 multiplies the local signal of frequency $f_{LO}+2\Delta f$ supplied from band-pass filter 74 by the signal supplied from band-pass filter 60 and outputs the resultant signal. Mixer 65 multiplies the local signal of frequency $f_{LO}+3\Delta f$ supplied from band-pass filter 75 by the signal supplied from band-pass filter 61 and outputs the resultant signal. Mixer 66 multiplies the local signal of frequency $f_{LO}+4\Delta f$ supplied from band-pass filter 76 by the signal supplied from band-pass filter 62 and outputs the resultant signal.

Adder 67 sums up the signals supplied from mixers 63 to 66 and outputs the resultant signal.

Low-pass filter 68 inputs the signal supplied from mixer 53 and passes and outputs the signal component of the frequency lower than frequency $f_{RF}-f_{LO}-\Delta f$ Low-pass filter 54 inputs the signal supplied from mixer 53 and passes and outputs the signal component of the frequency lower than frequency $f_{RF}-f_{LO}$.

Analog mixer 69 multiplies the signal supplied from low-pass filter 54 by the signal supplied from low-pass filter 68 to output the resultant signal.

Low-pass filter 70 inputs the signal supplied from analog mixer 69 and passes and outputs the signal component of the frequency lower than frequency $4\Delta f$.

A/D converter 71 performs A/D conversion of the signal supplied from low-pass filter 70 in synchronism with a sampling clock supplied from sampling clock generator 89.

FFT 72 performs fast Fourier transform of the data supplied from A/D converter 71 to determine the spectrum of the data.

Adder 77 sums up the local signals of frequencies $f_{LO}+\Delta f$, $f_{LO}+2\Delta f$, $f_{LO}+3\Delta f$ and $f_{LO}+4\Delta f$ supplied from band-pass filters 73 to 76, respectively.

Mixer 78 multiplies the output signal of adder 77 by the local signal $f_{LO}$ supplied from local signal generator 85 to output the resultant signal.

Low-pass filter 79 passes therethrough and outputs a signal component of a frequency lower than frequency $4\Delta f$.

A/D converter 80 performs A/D conversion of the signal supplied from low-pass filter 79 in synchronism with a sampling clock supplied from sampling clock generator 89.

FFT 81 performs fast Fourier transform of the data supplied from A/D converter 80 to determine a spectrum.

Cross spectrum calculator 82 calculates a cross spectrum between the spectrum determined by FFT 72 and the spectrum determined by FFT 81.

The cross spectrum between spectrum $S_a$ determined by FFT 72 and spectrum $S_b$ determined by FFT 81 is given by $S_a \cdot S_b^*$. Herein, $S_b^*$ represents a complex conjugate of $S_b$.

Arithmetic unit 83 performs the arithmetic processing necessary to display the cross spectrum calculated by cross spectrum calculator 82 and outputs a result of the calculation processing. Arithmetic unit 83 does not perform the processing necessary for amplitude and phase measurement.

Display unit 84 displays the phase differences and the amplitudes of the measurement signals using the data supplied from arithmetic unit 83.

In the following, operation of the present embodiment will be described with reference to FIG. 2.

First, operation for producing the local signals having frequencies $f_{LO}+\Delta f$, $f_{LO}+2\Delta f$, $f_{LO}+3\Delta f$ and $f_{LO}+4\Delta f$ will be described.

Signals $\Delta f$, $2\Delta f$, $3\Delta f$ and $4\Delta f$ having frequencies equal to integral number of times of frequency $\Delta f$ are supplied from M-sequence code generator 86 and multiplied by the local signal of frequency $f_{LO}$ to be and supplied at mixer 87. Consequently, the signals supplied from mixer 87 include signals of frequencies $f_{LO}+\Delta f$, $f_{LO}+2\Delta f$, $f_{LO}+3\Delta f$ and $f_{LO}+4\Delta f$. Then, by passing the signals through band-pass filters 73, 74, 75 and 76, respectively, the local signals of frequencies $f_{LO}+\Delta f$, $f_{LO}+2\Delta f$, $f_{LO}+3\Delta f$ and $f_{LO}+4\Delta f$ can be obtained, respectively.

Herein, the relationship among the phases of the local signals supplied from band-pass filters 73, 74, 75 and 76 depends upon the output signals of M-sequence code generator 86, and local signal generator 85 and M-sequence code generator 86 are phase-locked with reference to the signal supplied from reference signal source 88. For this reason, the relationship between the phases of the local signals is not varied by the timing at which power supply is turned on or some other factor. Further, even if the number of antennae is increased or decreased, the number of necessary local signal generators remains one.

Now, operation of measuring the phases and the amplitudes of the signals will be described below.

First, the reference signal of frequency $f_{RF}$ received by antenna 51 passes through band-pass filter 52 and then is multiplied by local signal 85 of frequency $f_{LO}$ by mixer 53. Then, only a signal of frequency $|f_{RF}-f_{LO}|$ passes through low-pass filter 54 and is outputted as an IF signal.

Meanwhile, the measurement signal of frequency $f_{Rf}$ received by antenna 55 first passes through band-pass filter 59 and then is multiplied by the local signal of frequency $f_{LO}+\Delta f$ supplied from band-pass filter 73 by mixer 63.

Also, the measurement signals detected by antennae 56, 57 and 58 having the same characteristic as that of antenna 55 and having passed through band-pass filters 60, 61 and 62 having the same characteristic as those of band-pass filters 52 and 59 undergo the same process as that for the measurement signal received by antenna 55. However, the local signals from band-pass filters 74, 75 and 76 applied to mixers 64, 65 and 66 have frequencies successively shifted by an integral number of times of frequency $\Delta f$ from the frequency of the local signal of band-pass filter 73 applied to mixer 63.

The output signals of mixers 63, 64, 65 and 66 are combined by adder 67. Signals with frequency differences of the local signals from those of band-pass filters 59 to 62 obtained as a result of the multiplication performed by mixers 63, 64, 65 and 66 are selected collectively through low-pass filter 68. In short, from the output signal of mixer 63, a signal of frequency $|f_{RF}-f_{LO}-\Delta f|$ is selected; from the output signal of mixer 64, a signal of frequency $|f_{RF}-f_{LO}-2\Delta f|$ is selected; from the output signal of mixer 65, a signal of frequency $|f_{RF}-f_{LO}-3\Delta f|$ is selected; and from the output signal of mixer 66, a signal of frequency $|f_{RF}-f_{LO}-4\Delta f|$ is selected similarly.

Then, the output signals of low-pass filter 68 and the output signal of low-pass filter 54 are multiplied by analog mixer 69. Since the output signals of low-pass filter 68 have frequencies successively shifted by an integral number of times of frequency $\Delta f$ with respect to the output signal of low-pass filter 54, the output signal of analog mixer 69 includes signals of frequencies equal to integral number of times of frequency $\Delta f$. Thereafter, the signals of the frequencies of the integral number of times of frequency $\Delta f$ are selected by and supplied from low-pass filter 70.

If the reference signal received by antenna 51 and the measurement signals received by antennae 55, 56, 57 and 58 have the same spectrum, the signals of the frequencies of the integral number of times of frequency $\Delta f$ are a plurality of signals having a single frequency. When the reference signal received by antenna 51 is used as a reference for the phase, phase information of the measurement signal received by antenna 55 is included in the signal of frequency $\Delta f$ supplied from analog mixer 69. The signal of frequency 2 Δf includes phase information of the measurement signal received by antenna 56; the signal of frequency 3 Δf includes phase information of the measurement signal received by antenna 57; and the signal of frequency 4 Δf includes phase information of the measurement signal received by antenna 58. Then, the amplitudes and the phases of the measurement signal are measured by A/D converting the output signal of low-pass filter 70 by A/D converter 71 and performing fast Fourier transform by FFT 72 to determine a spectrum.

However, since the signals of the frequencies of the integral number of times of frequency Δf include, in addition to the phase information of the measurement signals, phase displacements by band-pass filters 73, 74, 75 and 76, the correct phases cannot be measured only by the processing of FFT 72. Therefore, signals of the frequencies of the integral number of times of frequency Δf which include only information of the phase displacements by band-pass filters 73, 74, 75 and 76 are produced and a cross spectrum between the phases of the signals and the phases determined by FFT 72 is determined to remove the influence of the phase displacements by band-pass filters 73, 74, 75 and 76.

First, the output signals of band-pass filters 73, 74, 75 and 76 are composed by adder 77 and then are multiplied by local signal 85 of frequency $f_{LO}$ by and supplied from mixer 78. Then, the reference signals of the frequencies of the integral number of times of frequency Δf are selected by low-pass filter 79, A/D converted by A/D converter 80 and then fast Fourier transformed by FFT 81. It is to be noted that the A/D conversion operations of A/D converters 71 and 80 are synchronized with each other by common sampling clock 89. Then, a cross spectrum between the spectrum determined by FFT 72 and the spectrum determined by FFT 81 is calculated by cross spectrum calculator 82.

By the processing described above, the phases of the measurement signals of antennae 55, 56, 57 and 58 when the reference signal of antenna 51 is used as reference for the phase can be measured accurately. Then, the measured amplitudes and phases undergo calculation processing necessary for display by arithmetic unit 83 and are displayed on display unit 84.

Since the present embodiment performs multi-input amplitude and phase measurement using a plurality of antennae without using a switch, there is no necessity of taking the life, insertion loss and so forth of a switch into consideration, and consequently, reliability can be enhanced. Further, since the switching time of a switch is eliminated and measurement of the amplitudes and the phases can be started at an arbitrary timing when a measurement signal is received, the measurement can be performed at a high speed.

Further, since the present embodiment converts measurement signals received by a plurality of antennae into frequencies successively shifted at intervals of frequency Δf and performs processing of phase measurement of the measurement signals simultaneously by an FFT, a further increase of the speed of measurement can be anticipated.

SECOND EMBODIMENT

In the following, a multi-input amplitude and phase measuring device of a second embodiment of the present invention is described.

Figure 3:
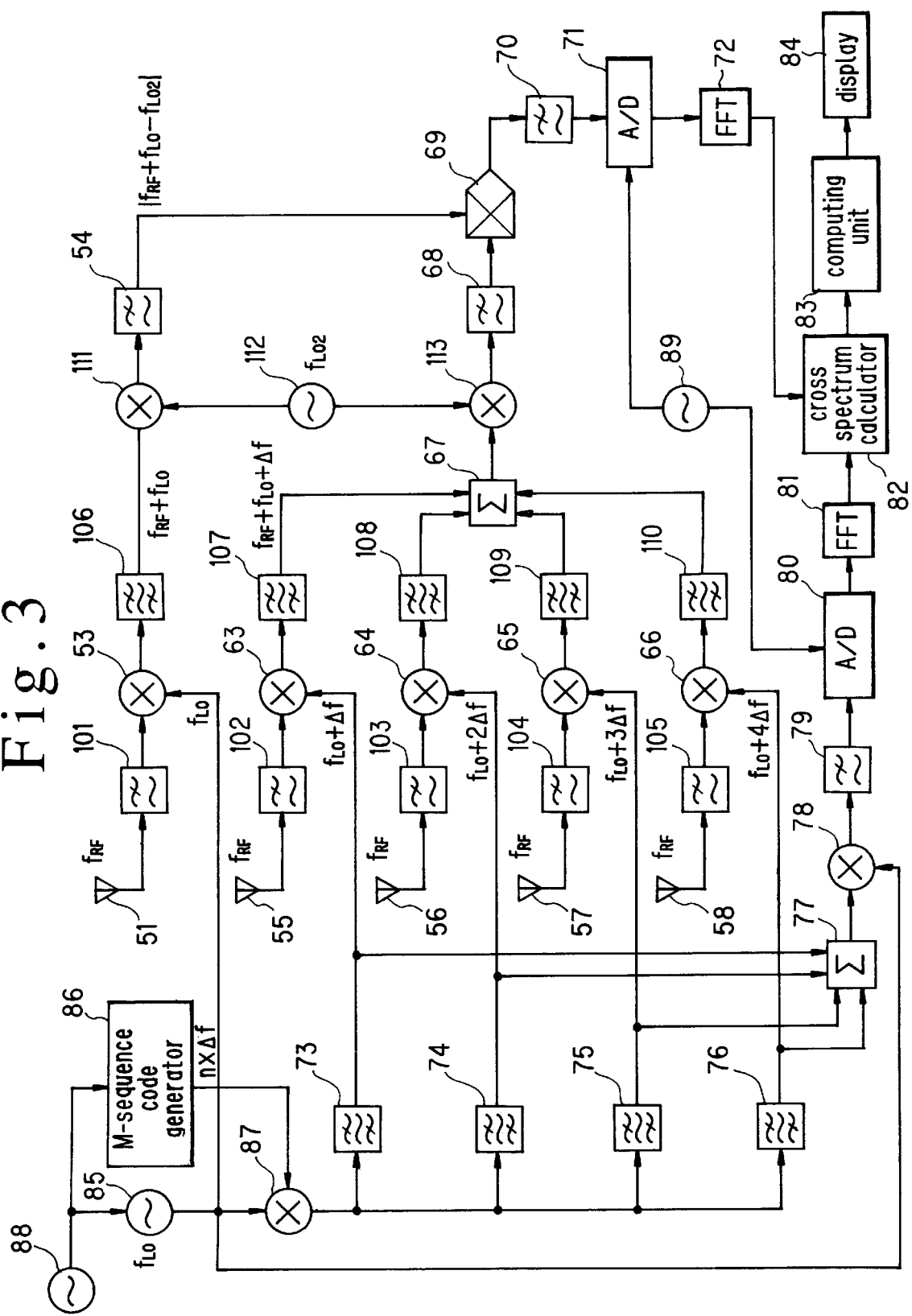
FIG. 3 is a block diagram showing a construction of a multi-input amplitude and phase measuring device of a second embodiment according to the present invention.

FIG. 3 is a block diagram showing a construction of the multi-input amplitude and phase measuring device of the second embodiment of the present invention.

The multi-input amplitude and phase measuring device of the present embodiment is a modification to and different from the first embodiment of FIG. 2 in that band-pass filters 52 and 59 to 62 are replaced by low-pass filters 101 to 105 and the output signals of mixers 53 and 63 to 66 are passed through band-pass filters 106 to 110, respectively. The multi-input amplitude and phase measuring device additionally includes local signal generator 112 for outputting a local signal of $f_{LO2}$, mixer 111 interposed between band-pass filter 106 and low-pass filter 54, and mixer 113 interposed between adder 67 and low-pass filter 68.

Low-pass filters 101 to 105 output signals component of lower than frequency $f_{RF}$.

Band-pass filter 106 passes therethrough and outputs only the signal of frequency $f_{RF}+f_{LO}$ supplied from mixer 53. Band-pass filter 107 passes therethrough and outputs only the signal of frequency $f_{RF}+f_{LO}+\Delta f$ supplied from mixer 63. Band-pass filter 108 passes therethrough and outputs only the signal of frequency $f_{RF}+f_{LO}+2\Delta f$ supplied from mixer 64. Band-pass filter 109 passes therethrough and outputs only the signal of frequency $f_{RF}+f_{LO}+3\Delta f$ supplied from mixer 65. Band-pass filter 110 passes therethrough and outputs only the signal of frequency $f_{RF}+f_{LO}+4\Delta f$ supplied from mixer 66.

Mixer 111 multiplies the signal supplied from band-pass filter 106 by the local signal of frequency $f_{LO2}$ supplied from local signal generator 112 and outputs the resultant signal. Mixer 113 multiplies the signal supplied from adder 67 by the local signal of frequency $f_{LO2}$ supplied from local signal generator 112 and outputs the resultant signal.

Operation of the present embodiment is described below with reference to FIG. 3.

The reference signal of frequency $f_{RF}$ received by antenna 51 first passes through low-pass filter 101 and then is multiplied by local signal 85 of frequency $f_{LO}$ by mixer 53. Then, the resultant signal is supplied to band-pass filter 106, through which a signal of frequency $|f_{RF}+f_{LO}|$ passes and is outputted as an IF signal. Then, the IF signal is further multiplied by the output signal of local signal generator 112 of frequency $f_{LO2}$ by mixer 111 and is supplied to low-pass filter 54, through which a signal of $|f_{RF}+f_{LO}-f_{LO2}|$ passes and is outputted.

Meanwhile, the measurement signal of frequency $f_{RF}$ received by antenna 55 passes through low-pass filter 102 and then is multiplied by a local signal of frequency $f_{LO}+\Delta f$ supplied from band-pass filter 73 by mixer 63. Then, the resultant signal is supplied to band-pass filter 107, through which only a signal of frequency $|f_{RF}+f_{LO}+\Delta f|$ passes and is outputted as an IF signal.

Also for the measurement signals received by antennae 56, 57 and 58 having the same characteristic as that of antenna 55 and passed through low-pass filters 103, 104 and 105 having the same characteristic as that of low-pass filters 101 and 102, the same process as that performed for the measurement signal received by antenna 55 is performed. However, the output signals of band-pass filter 74, 75 and 76 supplied to mixers 64, 65 and 66 have frequencies successively shifted by an integral number of times of frequency Δf with respect to the frequency of the output signal of band-pass filter 73 supplied to mixer 63.

Then, the output signals of band-pass filters 107, 108, 109 and 110 are combined by adder 67 and multiplied by the local signal of frequency $f_{LO2}$ by mixer 113, and the resultant signals with individual frequency differences are selected collectively by low-pass filter 68.

The output signals of low-pass filter 68 and the output signal of low-pass filter 54 are multiplied by analog mixer 69. Since the output signals of low-pass filter 68 have frequencies successively shifted by an integral number of times of frequency Δf with respect to the output signal of low-pass filter 54, the output signal of analog mixer 69 includes signals of the frequencies of the integral number of times of frequency Δf. The signals of the frequencies of the integral number of times of frequency Δf are selected by low-pass filter 70 and outputted.

The method of thereafter measuring the phases and the amplitudes of the measurement signals while eliminating the influence of phase displacement of band-pass filters 73, 74, 75 and 76 included in the signals of the frequencies of the integral number of times of frequency Δf is similar to that employed in the first embodiment described hereinabove.

By the process described above, the phases and the amplitudes of the measurement signals received by antennae 55, 56, 57 and 58 when the reference signal received by antenna 51 is used as a reference for the phase can be measured.

In the first embodiment of FIG. 2 described hereinabove, since received signals are converted into IF signals of low frequencies, the band-pass filters are provided next to the antennae so that the signals may not be disturbed by an image wave. However, since the low-pass filters are provided next to the mixers, the first embodiment is suitable for measuring signals of high frequencies of narrow bands.

Meanwhile, in the second embodiment of FIG. 3, since received signals are converted once into IF signals of high frequencies and then converted into IF signals of low frequencies again, low-pass filters are provided next to the antenna. However, since the band-pass filters are provided next to the mixers, the second embodiment is suitable for measurement of signals of low frequencies of narrow bands.

While, in the first and second embodiments, the number of antennae used is 5, the present invention is not limited to the specific number of antennae and can be applied also when the number of antennae is larger than 5.

While preferred embodiments of the present invention have been described using specific terms, such description is for illustrative purposes only, and it is to be understood that changes and variations may be made without departing from the spirit or scope of the following claims.

What is claimed is:

1. A multi-input amplitude and phase measuring method with the use of one of the signals of the same frequency received by a plurality of antennae as a reference signal for measuring the amplitudes and phases of the other signals, comprising the steps of:

converting the reference signal into a first intermediate frequency signal with a first local signal of a certain frequency;

converting the plurality of other signals into a plurality of second intermediate frequency signals with a plurality of second local signals of a plurality of frequencies which are successively different by certain fixed frequency intervals from that of the first local signal;

multiplying a signal obtained by adding the plurality of second intermediate frequency signals and the first intermediate frequency signal together to produce a plurality of signals of first fixed frequency intervals;

performing A/ID conversion and Fourier transform of the plurality of signals of the first fixed frequency intervals to determine a spectrum;

multiplying a signal obtained by adding the plurality of second local signals and the first local signal together to produce a plurality of signals of second fixed frequency intervals;

performing A/D conversion and Fourier transform of the plurality of signals of the second fixed frequency intervals to determine a spectrum; and calculating a cross spectrum between the spectrum of the signals of the first fixed frequency intervals and the spectrum of the signals of the second fixed frequency intervals to measure amplitudes and phases of the plurality of other signals with respect to the reference signal.

2. A multi-input amplitude and phase measuring method with the use of one of the signals of the same frequency received by a plurality of antennae as a reference signal for measuring the amplitudes and phases of the other signals, comprising the steps of:

converting the reference signal into a first intermediate frequency signal with a first local signal of a certain frequency;

converting the plurality of other signals into a plurality of second intermediate frequency signals with a plurality of second local signals of a plurality of frequencies which are successively different by certain fixed frequency intervals from that of the first local signal;

converting the first intermediate frequency signal into a third intermediate frequency signal with a third local signal having a frequency different from that of the first local signal;

multiplying a signal obtained by adding the plurality of second intermediate frequencies and the third local signal together to produce a fourth intermediate frequency signal;

multiplying the third intermediate frequency signal and the fourth intermediate frequency signal together to produce a plurality of signals of first fixed frequency intervals;

performing A/D conversion and Fourier transform of the plurality of signals of the first fixed frequency intervals to determine a spectrum;

multiplying a signal obtained by adding the plurality of second local signals and the first local signal together to produce a plurality of signals of second fixed frequency intervals;

performing A/D conversion and Fourier transform of the plurality of signals of the second fixed frequency intervals to determine a spectrum; and calculating a cross spectrum between the spectrum of the signals of the first fixed frequency intervals and the spectra of the signals of the second fixed frequency intervals to measure amplitudes and phases of the plurality of other signals with respect to the reference signal.

3. A multi-input amplitude and phase measuring device, comprising:

a first antenna for receiving a reference signal;

a first band-pass filter for passing therethrough only the reference signal received by said first antenna;

a first local signal generator for generating a first local signal;

a first mixer for multiplying the signal supplied from said first band-pass filter and the first local signal together and outputting the resultant signal together;

a first low-pass filter for passing therethrough only a signal of a low frequency band component of the signal supplied from said first mixer;

a plurality of second antennae for receiving measurement signals of the same frequency as that of the reference signal;

a plurality of second band-pass filters for passing therethrough only the measurement signals received by said second antennae;

a second local signal generator for outputting a plurality of second local signals of a plurality of frequencies which are successively different at certain fixed frequency intervals from that of the first local signal;

a plurality of second mixers for multiplying the plurality of signals supplied from said second band-pass filters and the plurality of second local signals and outputting the resultant signals together;

a first adder for summing up the plurality of signals together supplied from said second mixers;

a second low-pass filter for passing therethrough only a signal of a low frequency band component of the signal supplied from said first adder;

an analog multiplier for multiplying the output signal of said first low-pass filter and the output signal of said second lowpass filter together;

a third low-pass filter for passing therethrough only a signal of a low frequency component of the signal supplied from said analog multiplier;

a first A/D converter for performing A/D conversion of the signal supplied from said third low-pass filter with a predetermined sampling frequency;

a first FFT for performing Fourier transform of the result of the conversion of said first A/D converter;

a second adder for summing up the plurality of second local signals;

a third mixer for multiplying the signal supplied from said second adder and the first local signal together;

a fourth low-pass filter for passing therethrough only a signal of a low frequency band component of the signal supplied from said third mixer;

a second A/D converter for performing A/D conversion of the signal supplied from said fourth low-pass filter with the sampling frequency equal to that of said first A/D converter;

a second FFT for performing Fourier transform of a result of the conversion of said second A/D converter; and a cross spectrum calculator for calculating a cross spectrum between a spectrum determined by said first FFT and a spectrum determined by said second FFT.

4. A multi-input amplitude and phase measuring device as claimed in claim 3, wherein said second local signal generator includes:

an M-sequence code generator for generating a plurality of signals having frequencies equal to an integral number of times of the frequency which is the reference for the frequency intervals of the plurality of second local signals;

a fourth mixer for multiplying the first local signal and the plurality of signals supplied from said M-sequence code generator together; and a plurality of third band-pass filters for passing therethrough only signals of frequencies successively different by the frequency which is the reference for the frequency intervals of the second local signals from the frequency of the first local signal.

5. A multi-input amplitude and phase measuring device, comprising:

a first antenna for receiving a reference signal;

a first band-pass filter for passing therethrough only the reference signal received by said first antenna;

a first local signal generator for outputting a first local signal;

a first mixer for multiplying the signal supplied from said first band-pass filter and the first local signal and outputting the resultant signal;

a first band-pass filter for passing therethrough only a signal of that frequency of the signal supplied from said first mixer which is equal to a sum of the frequency of the reference signal and the frequency of the first local signal;

a plurality of second antennae for receiving measurement signals of the same frequency as that of the reference signal;

a plurality of second low-pass filters for passing therethrough the measurement signals received by said second antennae;

a second local signal generator for outputting a plurality of second local signals of a plurality of frequencies which are successively different at certain fixed frequency intervals from that of the first local signal;

a plurality of second mixers for multiplying the plurality of signals supplied from said second low-pass filters and the plurality of second local signals and outputting the resultant signals together;

a plurality of second band-pass filters for passing therethrough only signals of those frequencies of the signal supplied from said second mixers which are equal to sums of the frequency of the reference signal and the frequencies of the second local signals;

a first adder for summing up the signals supplied from said plurality of second band-pass filters;

a third local signal generator for outputting a third local signal of a frequency different from that of the first local frequency;

a third mixer for multiplying the signal supplied from said first band-pass filter and the third local signal together;

a third low-pass filter for passing therethrough only a signal of a low frequency band component of the signal supplied from said third mixer;

a fourth mixer for multiplying the signal supplied from said first adder and the third local signal together;

a fourth low-pass filter for passing therethrough only a signal of a low frequency band component of the signal supplied from said fourth mixer;

an analog multiplier for multiplying the output signal of said third low-pass filter and the output signal of said fourth low-pass filter together;

a fifth low-pass filter for passing therethrough only a signal of a low frequency band component of the signal supplied from said analog multiplier;

a first A/D converter for performing A/ID conversion of the signal supplied from said third low-pass filter with a predetermined sampling frequency;

a first FFT for performing Fourier transform of the result of the conversion by said first A/D converter;

a second adder for adding the plurality of second local signals;

a fifth mixer for multiplying the signal supplied from said second adder and the first local signal together;

a sixth low-pass filter for passing therethrough only a signal of a low frequency band component of the signal supplied from said fifth mixer;

a second A/D converter for performing A/D conversion of the signal supplied from said sixth low-pass filter with a sampling frequency equal to that of said first A/ID converter;

a second FFT for performing Fourier transform of the result of the conversion by said second A/D converter; and a cross spectrum calculator for calculating a cross spectrum between a spectrum determined by said first FFT and a spectrum determined by said second FFT.

6. A multi-input amplitude and phase measuring device as claimed in claim 5, wherein said second local signal generator includes:

an M-sequence code generator for generating a plurality of signals having frequencies equal to an integral number of times of the frequency which is the reference for the frequency intervals of the plurality of second local signals;

a fourth mixer for multiplying the first local signal and the plurality of signals supplied from said M-sequence code generator together; and a plurality of third band-pass filters for passing therethrough only signals of frequencies successively different by the frequency which is the reference for the frequency intervals of the second local signals from the frequency of the first local signal.

* * * * *